(12) United States Patent
Wang et al.

(10) Patent No.: US 11,991,915 B2
(45) Date of Patent: May 21, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Haoran Wang, Wuhan (CN); Kan Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 460 days.

(21) Appl. No.: 17/298,019

(22) PCT Filed: Mar. 31, 2021

(86) PCT No.: PCT/CN2021/084654
§ 371 (c)(1),
(2) Date: May 27, 2021

(87) PCT Pub. No.: WO2022/198710
PCT Pub. Date: Sep. 29, 2022

(65) Prior Publication Data
US 2023/0284511 A1 Sep. 7, 2023

(30) Foreign Application Priority Data
Mar. 24, 2021 (CN) .......................... 202110315219.0

(51) Int. Cl.
*H10K 59/80* (2023.01)
*H10K 59/131* (2023.01)

(52) U.S. Cl.
CPC ......... *H10K 59/879* (2023.02); *H10K 59/131* (2023.02)

(58) Field of Classification Search
CPC .......................... H10K 59/879; H10K 59/131
See application file for complete search history.

(56) References Cited

U.S. PATENT DOCUMENTS

2011/0254437 A1 10/2011 Yamada et al.
2016/0087245 A1 3/2016 Park et al.
(Continued)

FOREIGN PATENT DOCUMENTS

CN 103912820 A 7/2014
CN 107026240 A 8/2017
(Continued)

*Primary Examiner* — Christine A Enad
(74) *Attorney, Agent, or Firm* — PV IP PC; Wei Te Chung; Zhigang Ma

(57) ABSTRACT

The present application provides a display panel and a display device, the display panel includes a light-emitting layer and a light-concentrating layer positioned on the light-emitting layer, the light-emitting layer includes a plurality of light-emitting units, the light-concentrating layer includes a first member and a second member for converging light, wherein the first member includes a plurality of openings, an edge of the openings includes a first inclined surface for reflecting light and a second inclined surface positioned on the first inclined surface, and the first inclined surface and the second inclined surface are connected by a first connecting portion.

20 Claims, 5 Drawing Sheets

(56) References Cited

U.S. PATENT DOCUMENTS

2021/0231984 A1\* 7/2021 Wang ................. H01L 25/0753
2022/0165993 A1\* 5/2022 Leng ................... H10K 50/865

FOREIGN PATENT DOCUMENTS

| CN | 110082854 A | 8/2019 |
| --- | --- | --- |
| CN | 110473950 A | 11/2019 |
| CN | 111463364 A | 7/2020 |
| CN | 112216774 A | 1/2021 |
| CN | 112303594 A | 2/2021 |

\* cited by examiner

DISPLAY PANEL AND DISPLAY DEVICE

CROSS-REFERENCE TO RELATED APPLICATIONS

The present application is a Notional Phase of PCT Patent Application No. PCT/CN2021/084654 having international filing date of Mar. 31, 2021, which claims priority from a Chinese patent application filed with the China National Intellectual Property Administration on Mar. 24, 2021, with application number 202110315219.0, titled "DISPLAY PANEL AND DISPLAY DEVICE", which is incorporated herein by reference in its entirety.

FIELD OF INVENTION

The present application relates to a field of display technology and more particularly to a display panel and a display device.

BACKGROUND OF INVENTION

An organic light emitting diode (OLED) display is an active light emitting display device, which includes a plurality of active light emitting units, and a coordinated light emission of each active light emitting unit makes the display present different display images. Light emitted by each light-emitting unit can only be used for screen display within a specific emitting angle range, which is mainly reflected in a luminous efficiency of the display. The higher the luminous efficiency, the larger the proportion of the light emitted by the light-emitting unit that is used to display the screen. Therefore, under the same display conditions, the higher the luminous efficiency of the display, the lower the power consumption and the longer the lifespan of the display.

In order to improve the luminous efficiency of the display, a reflective structure is arranged on an upper layer of the light-emitting unit, and a light reflection effect of the reflective structure is utilized to converge the light emitted by the light-emitting unit toward the middle. The stronger the total reflection effect of the reflective structure to incident light, the better the luminous efficiency of the display. An ability of the reflective structure to reflect light is related to a slope and height of a reflective surface of the reflective structure. The smaller the slope, the more the light will be totally reflected; the greater the height, the more the light received by the reflective surface. However, the current reflective structure is difficult to have the advantages of both the small slope and the large height of the reflective surface, so an ability to reflect incident light of the current reflective structure is poor.

The current reflective structure provided in the display has a technical problem that its ability to reflect incident light is poor, resulting in poor luminous efficiency of the display.

SUMMARY OF INVENTION

The present application provides a display panel and a display device, which are used to alleviate the technical problem that the reflective structure in the current display has poor reflectivity to incident light.

The present application provides a display panel, including:
- a light-emitting layer comprising a plurality of light-emitting units; and
- a light-concentrating layer positioned on the light-emitting layer and comprising a first member and a second member, wherein the first member comprises a plurality of openings, an orthographic projection of at least a partial region of one of the openings on the light-emitting layer coincides with the light-emitting units, and the second member is filled in the openings;
- at least a partial edge of one of the openings comprises a first inclined surface, a second inclined surface positioned on the first inclined surface, and a first connecting portion connecting the first inclined surface and the second inclined surface, wherein an orthographic projection of at least part of the second inclined surface on a plane of a position of the light-emitting layer coincides with an orthographic projection of at least part of the first inclined surface on the plane of the position of the light-emitting layer; and
- wherein an optical refractive index of the second member is greater than an optical refractive index of the first member.

In the display panel of the present application, both the first inclined surface and the second inclined surface are annular inclined surfaces surrounding the edge of the opening.

In the display panel of the present application, the first connecting portion is around the edge of the opening and connected between the first inclined surface and the second inclined surface.

In the display panel of the present application, in a reference plane parallel to the plane of the position of the light-emitting layer, a first included angle is between the first inclined surface and the reference plane, and a second included angle is between the second inclined surface and the reference plane, and wherein the first included angle and the second included angle are both acute angles.

In the display panel of the present application, the first included angle is equal to the second included angle.

In the display panel of the present application, a height of the first inclined surface in a direction perpendicular to the plane of the position of the light-emitting layer is equal to a height of the second inclined surface in the direction perpendicular to the plane of the position of the light-emitting layer.

In the display panel of the present application, both the first inclined surface and the second inclined surface comprise an arc-shaped surface.

In the display panel of the present application, further including a first arc-shaped transition portion positioned between the first inclined surface and the first connecting portion.

In the display panel of the present application, further including a second arc-shaped transition portion positioned between the second inclined surface and the first connecting portion.

In the display panel of the present application, the first inclined surface includes a first terminal connected to the first arc-shaped transition portion and a second terminal opposite to the first terminal, and wherein a first connecting surface is a surface connecting the first terminal and the second terminal, and the first included angle includes an included angle between the first connecting surface and the reference plane.

In the display panel of the present application, the second inclined surface includes a third terminal connected to the second arc-shaped transition portion and a fourth terminal opposite to the third terminal, and wherein a second connecting surface is a surface connecting the third terminal and the fourth terminal, and the second included angle includes an included angle between the second connecting surface and the reference plane.

In the display panel of the present application, the opening further comprises a third inclined surface positioned on the second inclined surface and a second connecting portion connecting the second inclined surface and the third inclined surface.

In the display panel of the present application, an orthographic projection of at least part of the third inclined surface on the plane of the position of the light-emitting layer coincides with the orthographic projection of at least part of the second inclined surface on the plane of the position of the light-emitting layer.

In the display panel of the present application, a shape of an orthographic projection of the openings on the plane of the position of the light-emitting layer is same as a shape of an orthographic projection of a light emitting region of the light emitting units on the plane of the position of the light-emitting layer.

In the display panel of the present application, a cross section of the first member in a direction perpendicular to the plane of the position of the light-emitting layer is sawtooth-shaped.

In the display panel of the present application, a shape of an orthographic projection of one of the openings on the plane of the position of the light-emitting layer is a circle, an ellipse, or a polygon.

The present application also provides a display device, including a display panel, wherein the display panel includes:
 a light-emitting layer comprising a plurality of light-emitting units; and
 a light-concentrating layer positioned on the light-emitting layer and comprising a first member and a second member, wherein the first member comprises a plurality of openings, an orthographic projection of at least a partial region of one of the openings on the light-emitting layer coincides with the light-emitting units, and the second member is filled in the openings;
 at least a partial edge of one of the openings comprises a first inclined surface, a second inclined surface positioned on the first inclined surface, and a first connecting portion connecting the first inclined surface and the second inclined surface, wherein an orthographic projection of at least part of the second inclined surface on a plane of a position of the light-emitting layer coincides with an orthographic projection of at least part of the first inclined surface on the plane of the position of the light-emitting layer; and
 wherein an optical refractive index of the second member is greater than an optical refractive index of the first member.

In the display device of the present application, further including a touch layer and a polarizer; wherein
 the touch layer is positioned on the light-emitting layer;
 the light-concentrating layer is positioned on the touch layer; and
 the polarizer is positioned on the light-concentrating layer.

In the display device of the present application, the opening further comprises a third inclined surface positioned on the second inclined surface, and a second connecting portion connecting the second inclined surface and the third inclined surface, and wherein an orthographic projection of at least part of the third inclined surface on the plane of the position of the light-emitting layer coincides with the ortho-graphic projection of at least part of the second inclined surface on the plane of the position of the light-emitting layer.

In the display device of the present application, the first inclined surface, the second inclined surface, and the third inclined surface all comprise an arc-shaped surface.

The present application provides a display panel and a display device, the display panel includes a light-emitting layer and a light-concentrating layer positioned on the light-emitting layer, the light-emitting layer includes a plurality of light-emitting units, the light-concentrating layer includes a first member and a second member for converging light, wherein the first member includes a plurality of openings, an edge of the openings includes a first inclined surface for reflecting light and a second inclined surface positioned on the first inclined surface, and the first inclined surface and the second inclined surface are connected by a first connecting portion. The present application uses the two-layer inclined surface structure at an edge of the opening of the first member to form the upper and lower light reflecting surfaces. Therefore, the height of the reflection surface is increased, the amount of reflected light is increased, and the luminous efficiency of the display panel is improved under a condition of the same opening width.

DESCRIPTION OF FIGURES

In order to more clearly explain the technical solutions in the embodiments or the prior art, the following will briefly introduce the figures needed to be used in the description of the embodiments or the prior art. Obviously, the figures in the following description are only some embodiments of the application. For those of ordinary skill in the art, other figures can be obtained based on these figures without inventive steps.

DETAILED DESCRIPTION OF EMBODIMENTS

Figure 1:
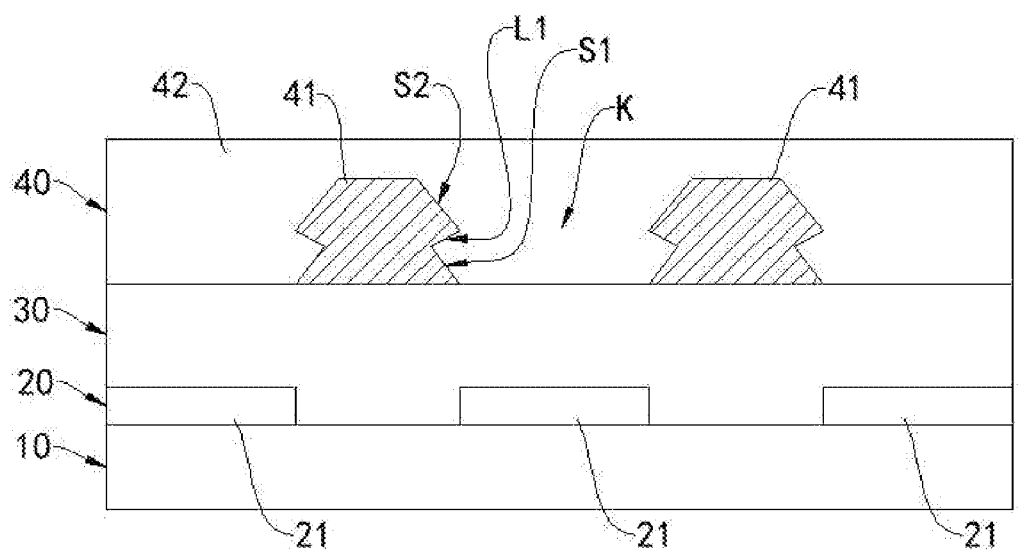
FIG. 1 is a schematic diagram of a first structure of a display panel provided by one embodiment of the present application.

The description of the following embodiments refers to the attached figures to illustrate specific embodiments that can be implemented in the present application. The directional terms mentioned in this application, such as top, bottom, front, rear, left, right, inside, outside, side, etc., are for reference the direction of the additional schema. Therefore, the used directional terms are for illustrate and understand the present application, rather than to limit the present application. In the figure, the units with similar structures are represented by the same reference numerals.

The embodiment of the present application provides a display panel. The display panel includes a light-emitting layer and a light-concentrating layer disposed on the light-emitting layer. The light-emitting layer includes a plurality of light-emitting units. The light-concentrating layer includes a first member and a second member for converging light. The first member is provided with a plurality of openings. An edge of the opening includes a first inclined surface for reflecting light and a second inclined surface positioned on the first inclined surface. The first inclined surface connects the second inclined surface by the first connecting portion connection. The present application uses a two-layer inclined surface structure of the opening edge of the first member to form an upper light reflection surface and a lower light reflection surface. Therefore, a height of the reflection surface is increased, an amount of reflected light is increased, and a luminous efficiency of the display panel is improved under a condition of the same opening width Please refer to FIG. 1. FIG. 1 is a schematic diagram of a first structure of a display panel provided by one embodiment of the present application. The display panel includes an array substrate 10, a light-emitting layer 20 disposed on the array substrate 10, a thin-film encapsulation layer 30 covering the light-emitting layer 20, and a light-concentrating layer 40 disposed on the thin-film encapsulation layer 30. The display panel uses the driving signal provided by the array substrate 10 to drive the light-emitting layer 20 to emit light, realizes a convergence of light by the light-concentrating layer 40, and finally, emits light in a certain direction on a light-emitting surface of the light-concentrating layer 40 to realize a display function of the display panel.

The array substrate 10 is provided with a driving circuit for driving the light-emitting unit in the light-emitting layer 20 to emit light. The driving circuit may include a plurality of driving signal traces and a plurality of thin film transistor devices, wherein the plurality of driving signal traces and the plurality of thin film transistor devices can be arranged in an array corresponding to the plurality of light-emitting units.

The light-emitting layer 20 includes a plurality of light-emitting units 21 for emitting light, and the plurality of light-emitting units 21 may be arranged in an array. The light-emitting layer 20 may include a pixel definition layer for realizing the array arrangement of the light-emitting units 21, wherein the pixel definition layer is provided with openings arranged in an array, and the plurality of light-emitting units 21 are arranged in the openings. The light-emitting unit 21 may include an anode, a light-emitting functional layer, and a cathode for realizing light-emitting function.

The thin-film encapsulation layer 30 may include a combined structure of an organic material layer and an inorganic material layer, which is used to seal and protect the light-emitting layer 20.

The light-concentrating layer 40 is positioned on the thin-film encapsulation layer 30 and includes a first member 41 and a second member 42 for converging light. The first member 41 is provided with an opening K, and the second member 41 is filled in the opening K. A thickness of the second member 42 in a direction perpendicular to a plane of a position of the light-emitting layer 20 is greater than or equal to a thickness of the first member 41 in the direction perpendicular to the plane of the position of the light-emitting layer 20. The first member 41 and the second member 42 are made of transparent materials, and an optical refractive index of the second member 42 is greater than an optical refractive index of the first member 41.

According to a principle of light propagation, when light is emitted from a material with a higher light refractive index to a material with a lower light refractive index, when an incident angle meets certain conditions, a total reflection of the light can be achieved. Therefore, in this embodiment, when light is emitted from the second member 42 to the first member 41, at the interface, as long as the angle between the interface and the incident light meets the condition of total reflection, the light can be totally reflected by the first member 41. The greater the amount of total reflection, the better the luminous efficiency of the display panel.

Further, an orthographic projection of at least a partial region of the opening K on the light-emitting layer 20 coincides with the light-emitting unit 21, and part or all of the light emitted by the light-emitting unit 21 is transmitted by the opening K and emitted into the light-concentrating layer 40. At least a partial edge of one of the openings K includes a first inclined surface S1, a second inclined surface S2 positioned on the first inclined surface S1, and a first connecting portion L1 connecting the first inclined surface S1 and the second inclined surface S2. The first inclined surface S1 and the second inclined surface S2 are effective reflection surfaces for the light emitted by the light emitting unit 21, and the light is reflected by the first inclined surface S1 or the second inclined surface S2 and then emits out the display panel from the opening K.

The light reflected by the first inclined surface S1 and the second inclined surface S2 into the opening K is effective light used to realize the display function of the display panel, and the un-reflected light cannot be used for screen display. Therefore, the greater the amount of reflected light, the higher the luminous efficiency of the display panel.

In addition, in order to achieve total reflection of more light, considering the incident direction of light from bottom to top, the reflecting surface needs to have a smaller inclined surface and a higher height. However, if the method of this embodiment is not adopted, that is, achieving a smaller slope of the reflecting surface and a higher height of the reflecting surface at the same time, the reflecting surface will have a larger span, that is, a maximum distance between two adjacent openings will be larger, which is not beneficial to improve the luminous efficiency of the display panel. However, in this embodiment, the edge of the opening K is set as an upper and lower two-layer inclined surface structure, which is beneficial to realize that the reflective surface has a smaller inclined surface and a higher height under the condition of the same opening pitch, thereby improving the luminous efficiency of the display panel.

Figure 2:
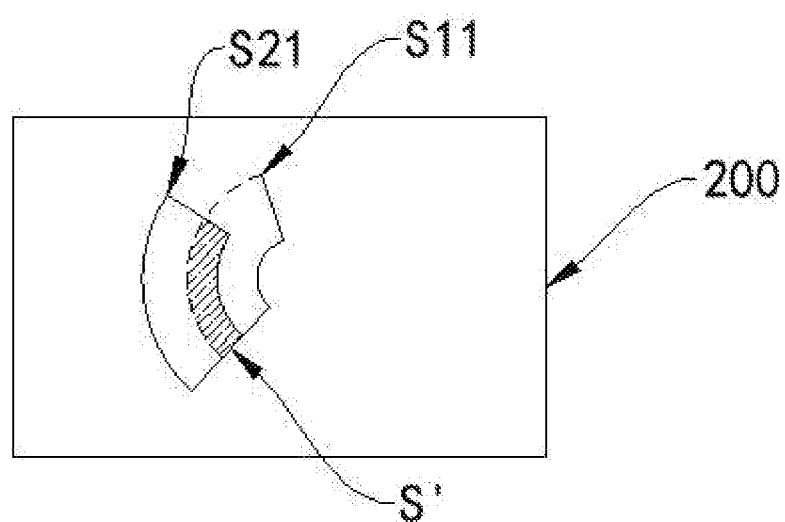
FIG. 2 is a schematic diagram of an orthographic projection of a first inclined surface and a second inclined surface on a plane of a position of a light-emitting layer.

Further, please refer to FIG. 1 and FIG. 2. FIG. 2 is a schematic diagram of an orthographic projection of the first inclined surface S1 and the second inclined surface S2 on the plane of the position of the light-emitting layer 20. The plane of the position of the light-emitting layer 20 is a plane 200, an orthographic projection of the first inclined surface S1 on the plane 200 is a first projection S11, and an orthographic projection of the second inclined surface S2 on the plane 200 is a second projection S21, wherein the first projection S11 and the second projection S21 have an overlapping region S', and the overlapping region S' is at least a portion of the first projection S11 or a portion of the second projection S21.

This embodiment can realize that on the premise that the first member 41 has a smaller opening pitch, the first member 41 has a smaller opening slope and a higher height, which is beneficial to improve the amount of light that is totally reflected and improve a luminous efficiency of the display panel. If defining a plane parallel to the plane of the position of the light-emitting layer as a reference plane, the so-called "opening slope" refers to an angle between the first inclined surface S1 and the reference plane being an acute angle, and an angle between the second inclined surface S2 and the reference plane is an acute angle.

Optionally, the first inclined surface S1 and the second inclined surface S2 are both annular inclined surfaces surrounding the edge of the opening K, and the first connecting portion L1 is connected between the first inclined surface S1 and the second inclined surface S2 around the edge of the opening K. In this embodiment, the sizes of the first inclined surface S1 and the second inclined surface S2 are maximized, thereby further increasing the amount of light that is totally reflected, and improving the luminous efficiency of the display panel.

Figure 3:
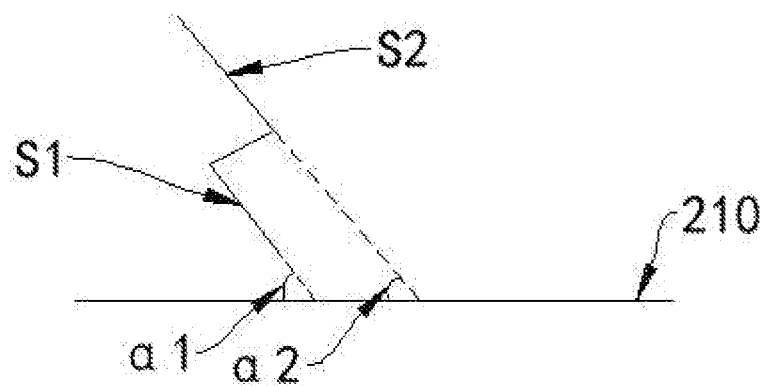
FIG. 3 is a schematic diagram of an angle between the first inclined surface and a reference plane, and an angle between the second inclined plane and the reference plane.

Further, please refer to FIG. 1 and FIG. 3. FIG. 3 is a schematic diagram of the angle between the first inclined surface and the reference plane, and the angle between the second inclined plane and the reference plane. Further, it is defined: the reference plane 210 is parallel to the plane of the position of the light-emitting layer 20, a first included angle $\alpha 1$ is between the first inclined surface S1 and the reference plane 210, and a second included angle $\alpha 2$ is between the second inclined surface S2 and the reference plane 210, wherein the first included angle $\alpha 1$ and the second included angle $\alpha 2$ are both acute angles. Optionally, the angles of the first included angle $\alpha 1$ and the second included angle $\alpha 2$ may be equal or different. When the first included angle $\alpha 1$ equals the second included angle $\alpha 2$, the first inclined surface S1 and the second inclined surface S2 have a similar ability to realize total reflection of light.

Optionally, a height of the first inclined surface S1 in a direction perpendicular to the plane of the position of the light-emitting layer 20 is equal to a height of the second inclined surface S2 in the direction perpendicular to the plane of the position of the light-emitting layer 20. When the first inclined surface S1 and the second inclined surface S2 have the same height in the direction perpendicular to the plane of the position of the light-emitting layer 20, and the first included angle $\alpha 1$ and the second included angle $\alpha 2$ are equal, the first inclined surface S1 and the second inclined surface S2 have a comparable ability to realize total reflection of light.

Optionally, a cross-section of the first member 41 in the direction perpendicular to the plane of the position of the light-emitting layer 20 is sawtooth-shaped.

Figure 7:
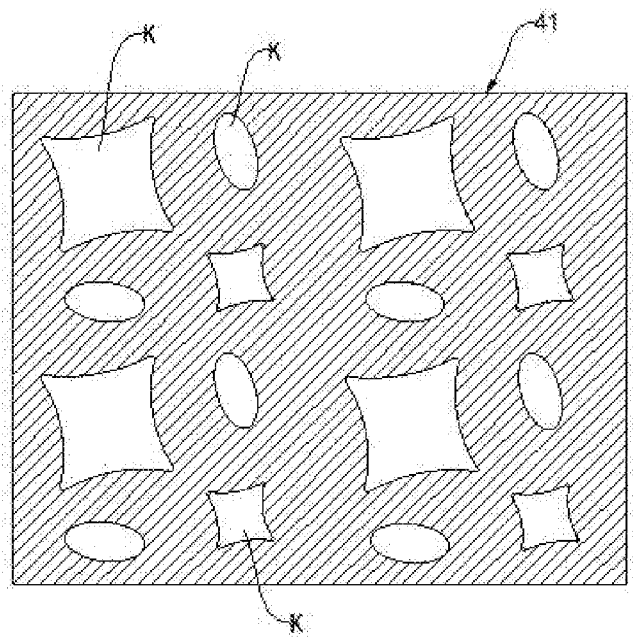
FIG. 7 is a schematic view of an opening shape of a first member.
Figure 8:
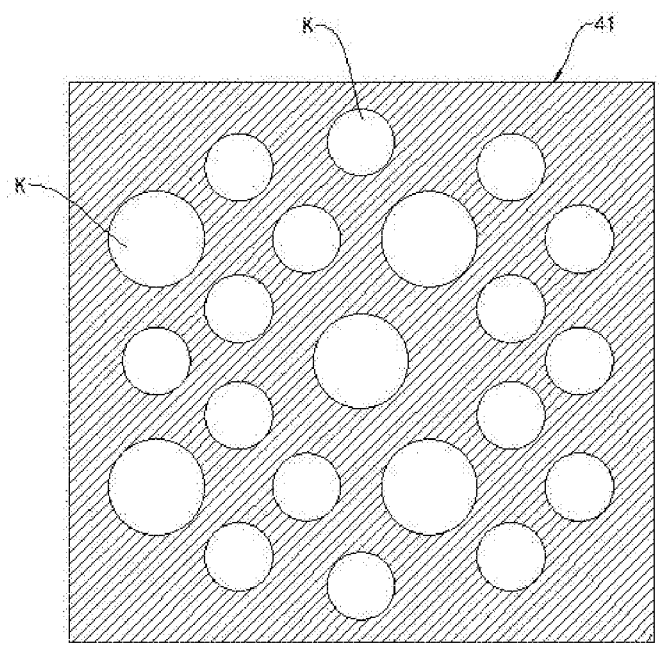
FIG. 8 is a schematic diagram of another opening shape of the first member.

Further, please refer to FIG. 1, FIG. 7, and FIG. 8. FIG. 7 and FIG. 8 are schematic diagrams of two opening shapes of the first member provided by the embodiment of the present application. A shape of an orthographic projection of the opening K on the plane of the position of the light-emitting layer 20 is the same as a shape of an orthographic projection of the light-emitting region of the light-emitting unit 21 on the plane of the position of the light-emitting layer 20, as shown in FIG. 7. According to the orthographic projection of the light-emitting region of the light-emitting unit 21, a shape of the orthographic projection of the opening K on the plane of the position of the light-emitting layer 20 may be oval or polygonal.

Optionally, the orthographic projection of the opening K on the plane of the position of the light-emitting layer 20 may also be larger than the orthographic projection of the light-emitting region of the light-emitting unit 21 on the plane of the position of the light-emitting layer 20. The shape of the orthographic projection of the opening K on the plane of the position of the light-emitting layer 20 may be circular, as shown in FIG. 7.

Figure 9:
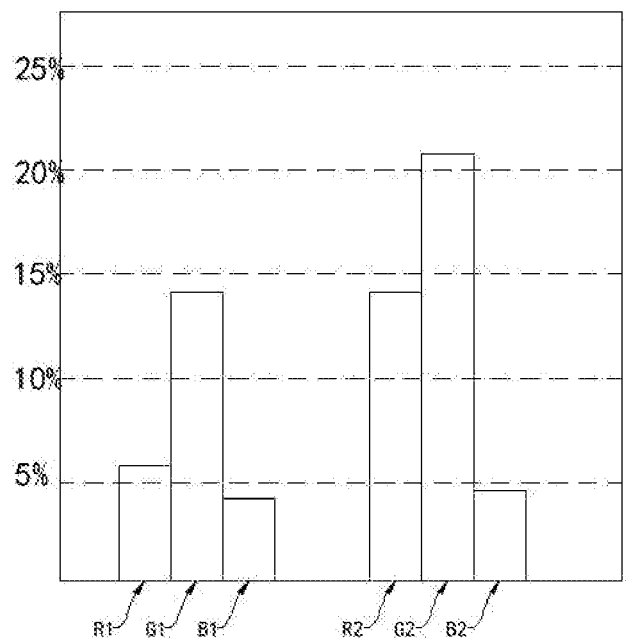
FIG. 9 is a figure showing a growth ratio of a luminous efficiency of the display panels corresponding to the two opening shapes of FIG. 7 and FIG. 8.

Please refer to FIG. 9. FIG. 9 is a figure showing a growth ratio of a luminous efficiency of the display panels corresponding to the two opening shapes of FIG. 7 and FIG. 8. For the embodiment shown in FIG. 8, a luminous efficiency increase R1 of red light is 6%, a luminous efficiency increase G1 of green light is 14%, and a luminous efficiency increase B1 of blue light is 4%. For the embodiment shown in FIG. 7, a luminous efficiency increase R2 of red light is 14%, a luminous efficiency increase G2 of green light is 21%, and a luminous efficiency increase B1 of blue light is 4.5%. It can be seen that when the shape of the orthographic projection of the opening K on the plane of the position of the light-emitting layer 20 is the same as the shape of the orthographic projection of the light-emitting region of the light-emitting unit 21 on the plane of the position of the light-emitting layer 20, the display panel has better luminous efficiency.

Figure 4:
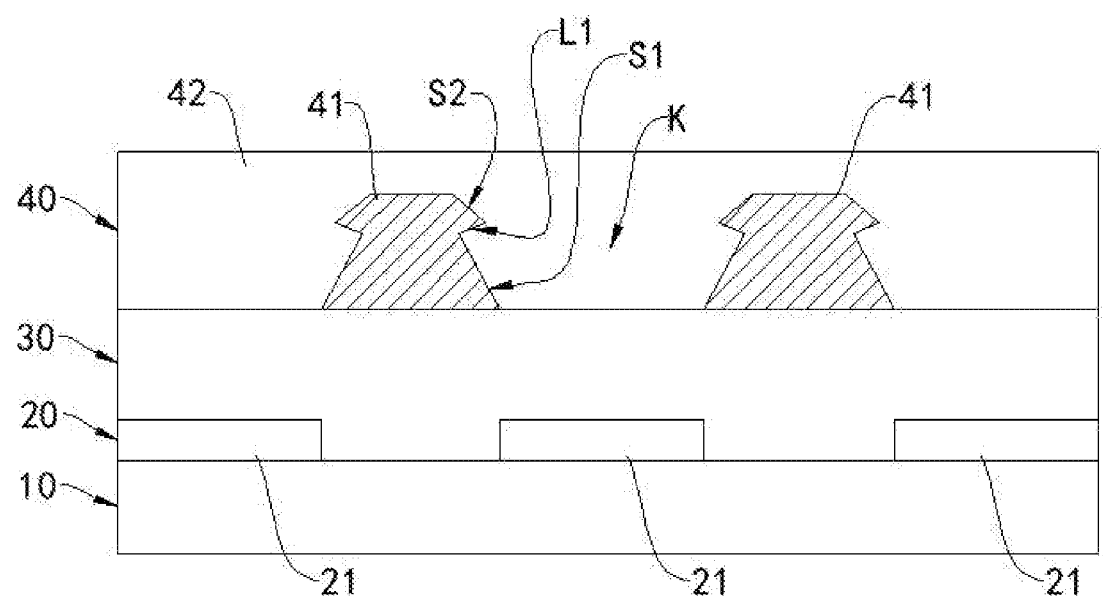
FIG. 4 is a schematic diagram of a second structure of the display panel provided by one embodiment of the present application.

In one embodiment, please refer to FIG. 4. FIG. 4 is a schematic diagram of a second structure of a display panel provided by one embodiment of the present application. The display panel shown in FIG. 4 has the same or similar structure as the display panel shown in FIG. 1; the structural features of the display panel shown in FIG. 4 will be described below, and for parts not described in detail, please refer to the above description of the structure of the display panel shown in FIG. 1.

The display panel includes an array substrate 10, a light-emitting layer 20 disposed on the array substrate 10, a thin-film encapsulation layer 30 covering the light-emitting layer 20, and a light-concentrating layer 40 disposed on the thin-film encapsulation layer 30. The array substrate 10 is provided with a driving circuit for driving the light-emitting layer 20 to emit light. The light-emitting layer 20 includes a plurality of light-emitting units 21 for emitting light, and the light-emitting units 21 are arranged in an array. The thin-film encapsulation layer 30 may include a combined structure of an organic material layer and an inorganic material layer, which is used to seal and protect the light-emitting layer 20.

The light-concentrating layer 40 is positioned on the thin-film encapsulation layer 30 and includes a first member 41 and a second member 42 for converging light. The first member 41 is provided with an opening K, and the second member 41 is filled in the opening K, a thickness of the second member 42 in the direction perpendicular to the plane of the light-emitting layer 20 is greater than or equal to a thickness of the first member 41 in the direction perpendicular to the plane of the light-emitting layer 20, the first member 41 and the second member 42 are made of transparent materials, and an optical refractive index of the second member 42 is greater than an optical refractive index of the first member 41.

Further, an orthographic projection of at least a partial region of the opening K on the light-emitting layer 20 coincides with the light-emitting unit 21, and part or all of the light emitted by the light-emitting unit 21 is incident into the light-concentrating layer 40 through the opening K. At least a partial edge of the opening K includes a first inclined surface S1, a second inclined surface S2 positioned on the first inclined surface S1, and a first connecting portion L1 connecting the first inclined surface S1 and the second inclined surface S2. In this embodiment, the edge of the opening K is disposed to have an upper and lower inclined surface structure, which is beneficial to make the reflective surface have a smaller inclined surface and a higher height under the condition of the same opening pitch, thereby improving the luminous efficiency of the display panel.

Further, the orthographic projection of at least a portion of the second inclined surface S2 on the plane of the position of the light-emitting layer 20 coincides with the orthographic projection of at least a portion of the first inclined surface S1 on the plane of the position of the light-emitting layer 20. Therefore, the first member 41 has a smaller opening slope and a higher height under the premise of a smaller opening pitch, which is beneficial to increase the amount of total reflection light and improve the luminous efficiency of the display panel.

Optionally, both the first inclined surface S1 and the second inclined surface S2 are annular inclined surfaces surrounding the edge of the opening K, and the first connecting portion L1 is connected between the first inclined surface S1 and the second inclined surface S2 around the edge of the opening K. In this embodiment, the size of the first inclined surface S1 and the second inclined surface S2 is maximized, thereby further increasing the amount of light that undergoes total reflection, and improving the luminous efficiency of the display panel.

Further, it is defined: a plane parallel to the plane of the position of the light-emitting layer 20 is a reference plane, a first included angle is between the first inclined surface S1 and the reference plane, and a second included angle is between the second inclined surface S2 and the reference plane, wherein the first included angle and the second included angle are both acute angles, and the angle of the first included angle and the angle of the second included angle may be equal or different.

According to the limitation of the manufacturing process of the first member 41, or according to the characteristics of the light-emitting angle of the display panel, a height of the first inclined surface S1 in the direction perpendicular to the plane of the position of the light-emitting layer 20 may be greater than a height of the second inclined surface S2 along the direction perpendicular to the plane of the position of the light-emitting layer 20, or the height of the first inclined surface S1 in the direction perpendicular to the plane of the position of the light-emitting layer 20 may also be less than the height of the second inclined surface S2 along the direction perpendicular to the plane of the position of the light-emitting layer 20.

Optionally, a cross-section of the first member 41 in a direction perpendicular to the plane of the position of the light-emitting layer 20 is sawtooth-shaped.

Further, the shape of the orthographic projection of the opening K on the plane of the position of the light-emitting layer 20 may be the same or different from the shape of the orthographic projection of the light-emitting region of the light-emitting unit 21 on the plane of the position of the light-emitting layer 20. The shape of the orthographic projection of the opening K on the plane of the position of the light-emitting layer 20 may be circular, oval, or polygonal.

Figure 5:
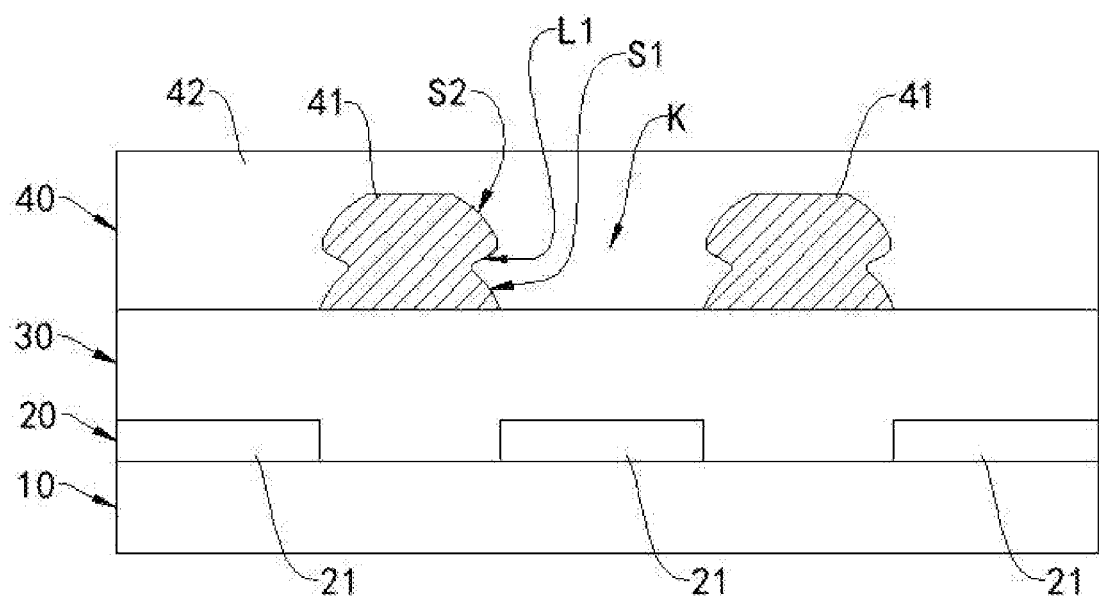
FIG. 5 is a schematic diagram of a third structure of the display panel provided by one embodiment of the present application.

In one embodiment, please refer to FIG. 5. FIG. 5 is a schematic diagram of a third structure of the display panel provided by one embodiment of the present application. The display panel shown in FIG. 5 has the same or similar structure as the display panel shown in FIG. 1; the structural features of the display panel shown in FIG. 5 will be described below, and for the parts that not described in detail, please refer to the above description of the structure of the display panel shown in FIG. 1.

The display panel includes an array substrate 10, a light-emitting layer 20 disposed on the array substrate 10, a thin-film encapsulation layer 30 covering the light-emitting layer 20, and a light-concentrating layer 40 disposed on the thin-film encapsulation layer 30. The array substrate 10 is provided with a driving circuit for driving the light-emitting layer 20 to emit light. The light-emitting layer 20 includes a plurality of light-emitting units 21 for emitting light, and the light-emitting units 21 are arranged in an array. The thin-film encapsulation layer 30 may include a combined structure of an organic material layer and an inorganic material layer, which is used to seal and protect the light-emitting layer 20.

The light-concentrating layer 40 is positioned on the thin-film encapsulation layer 30 and includes a first member 41 and a second member 42 for converging light. The first member 41 is provided with an opening K, and the second member 42 is filled in the opening K. A thickness of the second member 42 in a direction perpendicular to a plane of a position of the light-emitting layer 20 is greater than or equal to a thickness of the first member 41 in the direction perpendicular to the plane of the position of the light-emitting layer 20. Both the first member 41 and the second member 42 are made of transparent materials, and an optical refractive index of the second member 42 is greater than an optical refractive index of the first member 41.

Further, an orthographic projection of at least a partial region of the opening K on the light-emitting layer 20 coincides with the light-emitting unit 21, and part or all of the light emitted by the light-emitting unit 21 is incident into the light-concentrating layer 40 through the opening K. At least a partial edge of the opening K includes a first inclined surface S1, a second inclined surface S2 positioned on the first inclined surface S1, and a first connecting portion L1 connecting the first inclined surface S1 and the second inclined surface S2. Both the first inclined surface S1 and the second inclined surface S2 have arc-shaped surfaces. There is a first arc-shaped transition portion between the first inclined surface S1 and the first connecting portion L1, and the first arc-shaped transition portion is used to smoothly transition the first inclined surface S1 to the first connecting portion L1. There is a second arc-shaped transition portion between the second inclined surface S2 and the first connecting portion L1, and the second arc-shaped transition portion is used to smoothly transition the second inclined surface S2 to the first connecting portion L1.

In this embodiment, the edge of the opening K is disposed to have an upper and lower inclined surface structure, which is beneficial to make the reflective surface have a smaller inclined surface and a higher height under the condition of the same opening pitch, thereby improving the luminous efficiency of the display panel. In addition, the first inclined surface S1 and the second inclined surface S2 are arranged as arc-shaped surfaces, and are respectively connected to the first connecting portion L1 through an arc-shaped transition portion. On the one hand, this reduces a stress of the first member 41 at the opening K, and on the other hand, the arc-shaped inclined surface is also beneficial to further increase the reflection surface.

Further, the orthographic projection of at least a portion of the second inclined surface S2 on the plane of the position of the light-emitting layer 20 coincides with the orthographic projection of at least a portion of the first inclined surface S1 on the plane of the position of the light-emitting layer 20, thereby achieving the first member 41 having a smaller opening slope and a higher height under the premise of a smaller opening pitch, which is beneficial to increase the amount of light that undergoes total reflection and improve the luminous efficiency of the display panel.

Optionally, the first inclined surface S1 and the second inclined surface S2 are both annular inclined surfaces surrounding the edge of the opening K, and the first connecting portion L1 is connected to the edge of the opening K and between the first inclined surface S1 and the second inclined surface S2. In this embodiment, maximizing the size of the first inclined surface S1 and the second inclined surface S2 thereby further increases the amount of light that undergoes total reflection, and improves the luminous efficiency of the display panel.

Further, it is defined: a plane parallel to the plane of the position of the light-emitting layer 20 is a reference plane. The first inclined surface S1 includes a first terminal connecting the first arc-shaped transition portion and a second terminal opposite to the first terminal, and a plane connecting the first terminal and the second terminal has a first terminal. The connecting surface has a first included angle between the first connecting surface and the reference plane. The second inclined surface S2 includes a third terminal connecting the second arc-shaped transition portion and a fourth terminal opposite to the third terminal, and a plane connecting the third terminal and the fourth terminal has a second terminal. The connecting surface has a second included angle between the second connecting surface and the reference plane.

The first included angle and the second included angle are both acute angles, and the angle of the first included angle and the angle of the second included angle may be equal or different.

According to the limitation of the manufacturing process of the first member 41, or according to the characteristics of the light-emitting angle of the display panel, a height of the first inclined surface S1 in the direction perpendicular to the plane of the position of the light-emitting layer 20 may be higher than a height of the second inclined surface S2 in the direction perpendicular to the plane of the position of the light-emitting layer 20, or the height of the first inclined surface S1 in the direction perpendicular to the plane of the position of the light-emitting layer 20 may also be lower than the height of the second inclined surface S2 in the direction perpendicular to the plane of the position of the light-emitting layer 20.

Optionally, a cross-section of the first member 41 in the direction perpendicular to the plane of the position of the light-emitting layer 20 is sawtooth-shaped.

Further, a shape of the orthographic projection of the opening K on the plane of the position of the light-emitting layer 20 may be the same or different from a shape of the orthographic projection of the light-emitting region of the light-emitting unit 21 on the plane of the position of the light-emitting layer 20. The shape of the orthographic projection of the opening K on the plane of the position of the light-emitting layer 20 may be circular, oval, or polygonal.

Figure 6:
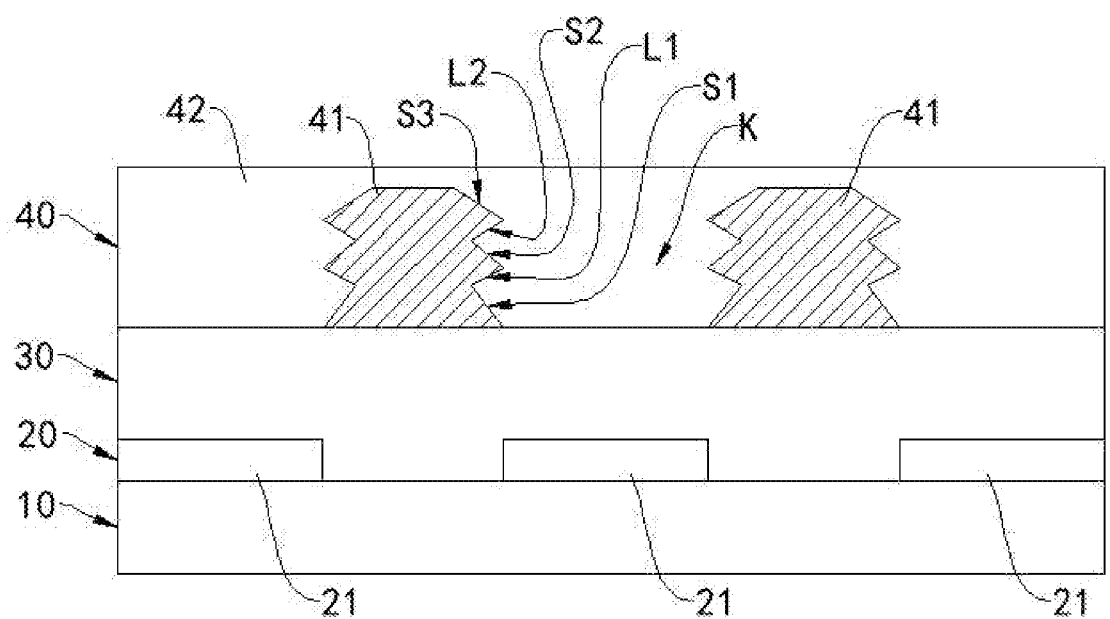
FIG. 6 is a schematic diagram of a fourth structure of the display panel provided by one embodiment of the present application.

In one embodiment, please refer to FIG. 6. FIG. 6 is a schematic diagram of a fourth structure of the display panel provided by one embodiment of the present application. The display panel shown in FIG. 6 has the same or similar structure as the display panel shown in FIG. 1; the structural features of the display panel shown in FIG. 6 will be described below, and for parts that not described in detail, please refer to the above description of the structure of the display panel shown in FIG. 1.

The display panel includes an array substrate 10, a light-emitting layer 20 disposed on the array substrate 10, a thin-film encapsulation layer 30 covering the light-emitting layer 20, and a light-concentrating layer 40 disposed on the thin-film encapsulation layer 30. The array substrate 10 is provided with a driving circuit for driving the light-emitting layer 20 to emit light. The light-emitting layer 20 includes a plurality of light-emitting units 21 for emitting light, and the light-emitting units 21 are arranged in an array. The thin-film encapsulation layer 30 may include a combined structure of an organic material layer and an inorganic material layer, which is used to seal and protect the light-emitting layer 20.

The light-concentrating layer 40 is positioned on the thin-film encapsulation layer 30 and includes a first member 41 and a second member 42 for converging light. The first member 41 is provided with an opening K, and the second member 41 is filled in the opening K; a thickness of the second member 42 in the direction perpendicular to the plane of the light-emitting layer 20 is greater than or equal to a thickness of the first member 41 in the direction perpendicular to the plane of the light-emitting layer 20, the first member 41 and the second member 42 are made of transparent materials, and an optical refractive index of the second member 42 is greater than an optical refractive index of the first member 41.

Further, an orthographic projection of at least a partial region of the opening K on the light-emitting layer 20 coincides with the light-emitting unit 21, and part or all of the light emitted by the light-emitting unit 21 is transmitted by the opening K and emitted into the light-concentrating layer 40. At least a partial edge of one of the openings K includes a first inclined surface S1, a second inclined surface S2 positioned on the first inclined surface S1, a third inclined surface S3 positioned on the second inclined surface S2, a first connecting portion L1 connecting the first inclined surface S1 and the second inclined surface S2, and a second connecting portion L2 connecting the second inclined surface S2 and the third inclined surface S3. In this embodiment, the edge of the opening K is disposed to have an upper and lower of three-layer inclined surface structure, which is beneficial to further reduce a slope of the reflective surface and increase a height of the reflective surface under the condition of the same opening pitch, thereby further improving the luminous efficiency of the display panel.

Further, the orthographic projection of at least a portion of the second inclined surface S2 on the plane of the position of the light-emitting layer 20 coincides with the orthographic projection of at least a portion of the first inclined surface S1 on the plane of the position of the light-emitting layer 20. The orthographic projection of at least a portion of the third inclined plane S3 on the plane of the position of the light-emitting layer 20 coincides with the orthographic projection of at least a portion of the second inclined surface S2 on the plane of the position of the light-emitting layer 20. This embodiment can realize that the first member 41 has a smaller opening slope and a higher height under the premise of a smaller opening pitch, which is beneficial to increase the amount of totally reflected light and improve a luminous efficiency of display panel.

Optionally, the first inclined surface S1, the second inclined surface S2, and the third inclined surface S3 are all annular inclined surfaces surrounding the edge of the opening K, and the first connecting portion L1 surrounds the edge of the opening K and is connected between the first inclined surface S1 and the second inclined surface S2, and the second connecting portion L2 surrounds the edge of the opening K and is connected between the second inclined surface S2 and the third inclined surface S3. In this embodiment, the sizes of the first inclined surface S1, the second inclined surface S2, and the third slope S3 are maximized, thereby further increasing the amount of total reflection light and improving the luminous efficiency of the display panel.

Further, it is defined: a plane parallel to the plane of the position of the light-emitting layer 20 is a reference plane, a first included angle is between the first inclined surface S1 and the reference plane, a second included angle is between the second inclined surface S2 and the reference plane, a third included angle is between the third inclined plane S3 and the reference plane, wherein the first included angle, the second included angle, and the third included angle are all acute angles, and the angle of the first included angle, the angle of the second included angle, and the angle of the third included angle may be equal or different.

A height of the first inclined surface S1 in the direction perpendicular to the plane of the position of the light-emitting layer 20 is a first height, a height of the second inclined surface S2 in the direction perpendicular to the plane of the position of the light-emitting layer 20 is a second height, and a height of the third inclined surface S3 in the direction perpendicular to the plane of the position of the light-emitting layer 20 is a third height. According to the limitation of the manufacturing process of the first member 41, or according to the characteristics of the light emitting angle of the display panel, the first height, the second height, and the third height may be equal or different.

Optionally, the first inclined surface S1, the second inclined surface S2, and the third inclined surface S3 all have arc-shaped surfaces, wherein a first arc-shaped transition portion is positioned between the first inclined surface S1 and the first connecting portion L1, and the first arc-shaped transition portion is used to smoothly transition the first inclined surface S1 to the first connecting portion L1; a second arc-shaped transition portion is positioned between the second inclined surface S2 and the first connecting portion L1, and the second arc-shaped transition portion is used to smoothly transition the second inclined surface S2 to the first connecting portion L1; a third arc-shaped transition portion is positioned between the second inclined surface S2 and the second connecting portion L2, and the third arc-shaped transition portion is used to smoothly transition the second inclined surface S2 to the second connecting portion L2; a fourth arc-shaped transition portion is positioned between third inclined surface S3 and the second connecting portion L2, and the fourth arc-shaped transition portion is used to smoothly transition the third inclined surface S3 to the second connecting portion L2.

The first inclined surface S1 includes a first terminal connecting the first arc-shaped transition portion and a second terminal opposite to the first terminal, wherein a first plane is a plane connecting the first terminal and the second terminal, and the first included angle includes an included angle between the first connecting surface and the reference plane. The second inclined surface S2 includes a third terminal connecting the second arc-shaped transition portion and a fourth terminal opposite to the third terminal, wherein a second plane is a plane connecting the third terminal and the fourth terminal. the second included angle includes an included angle between the second connecting surface and the reference plane.

In this embodiment, the first inclined surface S1, the second inclined surface S2, and the third inclined surface S3 are set as arc-shaped surfaces, and are respectively connected to the first connecting portion L1 and the second connecting portion L2 through an arc-shaped transition portion. On the one hand, this reduces a stress of the first member 41 at the opening K, and on the other hand, the arc-shaped inclined surface is also beneficial to further increase the reflection surface.

Optionally, a cross-section of the first member 41 in the direction perpendicular to the plane of the position of the light-emitting layer 20 is sawtooth-shaped.

Further, a shape of the orthographic projection of the opening K on the plane of the position of the light-emitting layer 20 may be the same or different from a shape of the orthographic projection of the light-emitting region of the light-emitting unit 21 on the plane of the position of the light-emitting layer 20. The shape of the orthographic projection of the opening K on the plane of the position of the light-emitting layer 20 may be circular, oval, or polygonal.

On the basis of the embodiment of the present application, the edge of the opening K may also have more than 3 inclined surfaces. The specific structural features are the same as or similar to the technical features disclosed in the embodiment of the present application, and will not be repeated here.

Figure 10:
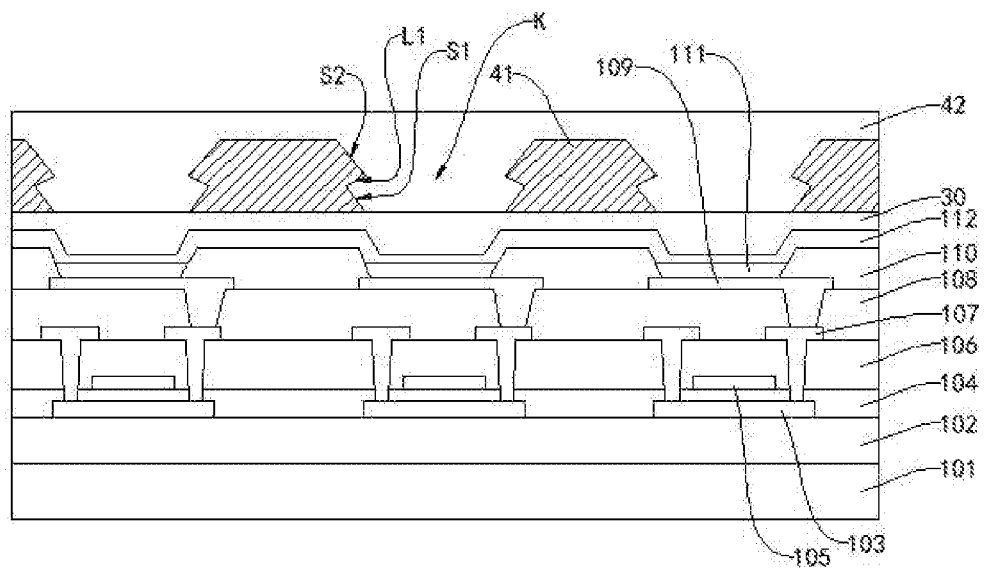
FIG. 10 is a schematic diagram of a fifth structure of the display panel provided by one embodiment of the present application.

In one embodiment, please refer to FIG. 10. FIG. 10 is a schematic diagram of a fifth structure of the display panel provided by one embodiment of the present application. The display panel shown in FIG. 10 has the same or similar structure as the display panel shown in FIG. 1; the structural features of the display panel shown in FIG. 10 will be described below, and for the parts that not described in detail, please refer to the above description of the structure of the display panel shown in FIG. 1.

The display panel includes an array substrate, a light-emitting layer provided on the array substrate, and a light-concentrating layer provided on the light-emitting layer.

The array substrate includes a base substrate 101, a buffer layer 102 disposed on the base substrate 101, a semiconductor layer 103 disposed on the buffer layer 102, a gate insulating layer 104 covering the semiconductor layer 103, a gate electrode 105 disposed on the gate insulating layer 104, an interlayer insulating layer 106 covering the gate electrode 105, source and drain electrodes 107 disposed on the interlayer insulating layer 106, and a planarization layer 108 covering the the source and drain electrodes 107, wherein the source and drain electrodes 107 are connected to opposite terminals of the semiconductor layer 103 by a through hole of the gate insulating layer 104 and the interlayer insulating layer 106, and wherein the semiconductor layer 103, the gate electrode 105, and the source and drain electrodes 107 constitute a thin film transistor device.

The light-emitting layer includes an anode 109 disposed on the planarization layer 108, a pixel definition layer 110 disposed on the planarization layer 108 and includes an opening corresponding to the anode 109, the light-emitting function layer 111 disposed in the opening of the pixel definition layer 110, a cathode 112 disposed on the light-emitting function layer 111, and a thin-film encapsulation layer 30 covering the cathode 112, wherein the anode 109 is connected to the source and drain electrodes 107 by a through hole of the planarization layer 108. The array substrate provides a driving signal to the light-emitting layer to drive the light-emitting layer to emit light.

The light-concentrating layer includes a first member 41 and a second member 42 disposed on the thin-film encapsulation layer 30, the first member 41 is provided with an opening K, and the second member 42 is filled in the opening K. A thickness of the second member 42 in a direction perpendicular to the plane of the light-emitting layer 20 is greater than or equal to a thickness of the first member 41 in the direction perpendicular to the plane of the light-emitting layer 20, the first member 41 and the second member 42 are made of transparent materials, and an optical refractive index of the second member 42 is greater than an optical refractive index of the first member 41.

An orthographic projection of at least a partial region of the opening K on the light-emitting layer coincides with the light-emitting function layer 111, at least a partial edge of the opening K includes a first inclined surface S1, a second inclined surface S2 positioned on the first inclined surface S1, and a first connecting portion L1 connecting the first inclined surface S1 and the second inclined surface S2. An orthographic projection of at least a portion of the second inclined surface S2 on the plane of the position of the light-emitting layer coincides with an orthographic projection of at least a portion of the first inclined surface S1 on the plane of the position of the light-emitting layer. Therefore, the first member 41 has a smaller opening slope and a higher height under the premise of a smaller opening pitch, which is beneficial to increase the amount of total reflection light and improve the luminous efficiency of the display panel.

Optionally, both the first inclined surface S1 and the second inclined surface S2 are annular inclined surfaces surrounding the edge of the opening K, the first connecting portion L1 is connected between the first inclined surface S1 and the second inclined surface S2 around the edge of the opening K.

Further, a shape of the orthographic projection of the opening K on the plane of the position of the light-emitting layer may be the same as or different from a shape of the light-emitting function layer 111. The shape of the orthographic projection of the opening K on the plane of the position of the light-emitting layer may be circular, oval, or polygonal.

Further, it is defined: a plane parallel to the plane of the position of the light-emitting layer is a reference plane, a first included angle is between the first inclined surface S1 and the reference plane, and a second included angle is between the second inclined surface S2 and the reference plane, wherein the first included angle and the second included angle are both acute angles, and the angle of the first included angle and the angle of the second included angle may be equal or different.

A height of the first inclined surface S1 in a direction perpendicular to the plane of the position of the light-emitting layer is a first height, and a height of the second inclined surface S2 in the direction perpendicular to the plane of the position of the light-emitting layer is a second height. According to the limitation of the manufacturing process of the first member 41, or according to the characteristics of the light emitting angle of the display panel, the first height and the second height may be equal or different.

Optionally, both the first inclined surface S1 and the second inclined surface S2 have arc-shaped surfaces, wherein a first arc-shaped transition portion is positioned between the first inclined surface S1 and the first connecting portion L1, and the first arc-shaped transition portion is used to smoothly transition the first inclined surface S1 to the first connecting portion L1, a second arc-shaped transition portion is positioned between the second inclined surface S2 and the first connecting portion L1, and the second arc-shaped transition portion is used to smoothly transition the second inclined surface S2 to the first connecting portion L1. In this embodiment, the first inclined surface S1 and the second inclined surface S2 are disposed as arc-shaped surfaces, and are respectively connected to the first connecting portion L1 by the arc-shaped transition portion. On the one hand, this reduces a stress of the first member 41 at the opening K, on the other hand, the arc-shaped inclined surface is also beneficial to further increasing the reflection surface.

The first inclined surface S1 includes a first terminal connecting the first arc-shaped transition portion and a second terminal opposite to the first terminal, wherein a first plane is a plane connecting the first terminal and the second terminal, the first included angle includes an included angle between the first connecting surface and the reference plane. The second inclined surface S2 includes a third terminal connecting the second arc-shaped transition portion and a fourth terminal opposite to the third terminal, wherein a second plane is a plane connecting the third terminal and the fourth terminal, and the second included angle includes an included angle between the second connecting surface and the reference plane.

Optionally, the edge of the opening K may also have more than 2 inclined surfaces. The specific structural features are the same as or similar to the technical features disclosed in the embodiment of the present application, and will not be repeated here.

Optionally, the cross-section of the first member 41 in a direction perpendicular to the plane of the position of the light-emitting layer is sawtooth-shaped.

In summary, the display panel provided by the embodiments of the present application includes a light-emitting layer and a light-concentrating layer disposed on the light-emitting layer. The light-emitting layer includes a plurality of light-emitting units. The light-concentrating layer includes a first member and a second member for converging light. The first member is provided with a plurality of openings, and an edge of the opening includes a multi-layer inclined surface for reflecting light. The present application uses the multi-layer inclined surface structure of the opening edge of the first member to form the upper and lower multi-layer light reflecting surfaces, which is beneficial to realize that the reflective surface has a smaller inclined surface and a higher height under a condition of the same opening pitch, thereby improving the luminous efficiency of the display panel.

One embodiment of the application further provides a display device, the display device includes the display panel provided by the embodiments of the present application, and the display panel includes: a light-emitting layer, a light-concentrating layer, a touch layer, and a polarizer, wherein the touch layer is positioned on the light-emitting layer, the light-concentrating layer is positioned on the touch layer, and the polarizer is positioned on the light-concentrating layer. The display device may be a device with a display function, such as a mobile phone, a notebook computer, a tablet computer, a television, and a navigator.

It should be noted that although the present application is disclosed as above in specific embodiments, the above-mentioned embodiments are not intended to limit the application, and those of ordinary skill in the art can make various modifications without departing from the spirit and scope of the present application. Therefore, a protection scope of the present application is subject to the scope defined by the claims.

What is claimed is:
1. A display panel, comprising:
 a light-emitting layer comprising a plurality of light-emitting units; and
 a light-concentrating layer positioned on the light-emitting layer and comprising a first member and a second member, wherein the first member comprises a plurality of openings, an orthographic projection of at least a partial region of one of the openings on the light-emitting layer coincides with the light-emitting units, and the second member is filled in the openings;

at least a partial edge of one of the openings comprises a first inclined surface, a second inclined surface positioned on the first inclined surface, and a first connecting portion connecting the first inclined surface and the second inclined surface, wherein an orthographic projection of at least part of the second inclined surface on a plane of a position of the light-emitting layer coincides with an orthographic projection of at least part of the first inclined surface on the plane of the position of the light-emitting layer; and wherein an optical refractive index of the second member is greater than an optical refractive index of the first member; both the first inclined surface and the second inclined surface are annular inclined surfaces surrounding the edge of the opening, in a reference plane parallel to the plane of the position of the light-emitting layer, a first included angle is between the first inclined surface and the reference plane, and a second included angle is between the second inclined surface and the reference plane, and wherein the first included angle and the second included angle are both acute angles.

2. The display panel according to claim 1, wherein the first connecting portion is around the edge of the opening and connected between the first inclined surface and the second inclined surface.

3. The display panel according to claim 1, wherein the first included angle is equal to the second included angle.

4. The display panel according to claim 1, wherein a height of the first inclined surface in a direction perpendicular to the plane of the position of the light-emitting layer is equal to a height of the second inclined surface in the direction perpendicular to the plane of the position of the light-emitting layer.

5. The display panel according to claim 1, wherein both the first inclined surface and the second inclined surface comprise an arc-shaped surface.

6. The display panel according to claim 5, further comprising a first arc-shaped transition portion positioned between the first inclined surface and the first connecting portion.

7. The display panel according to claim 6, further comprising a second arc-shaped transition portion positioned between the second inclined surface and the first connecting portion.

8. The display panel according to claim 7, wherein the first inclined surface comprises a first terminal connected to the first arc-shaped transition portion and a second terminal opposite to the first terminal, and wherein a first connecting surface is a surface connecting the first terminal and the second terminal, and the first included angle comprises an included angle between the first connecting surface and the reference plane.

9. The display panel according to claim 8, wherein the second inclined surface comprises a third terminal connected to the second arc-shaped transition portion and a fourth terminal opposite to the third terminal, and wherein a second connecting surface is a surface connecting the third terminal and the fourth terminal, and the second included angle comprises an included angle between the second connecting surface and the reference plane.

10. The display panel according to claim 1, wherein a shape of an orthographic projection of the openings on the plane of the position of the light-emitting layer is same as a shape of an orthographic projection of a light emitting region of the light emitting units on the plane of the position of the light-emitting layer.

11. The display panel according to claim 1, wherein a cross section of the first member in a direction perpendicular to the plane of the position of the light-emitting layer is sawtooth-shaped.

12. The display panel according to claim 1, wherein a shape of an orthographic projection of one of the openings on the plane of the position of the light-emitting layer is circular, oval, or polygonal.

13. A display panel, comprising:
a light-emitting layer comprising a plurality of light-emitting units; and
a light-concentrating layer positioned on the light-emitting layer and comprising a first member and a second member, wherein the first member comprises a plurality of openings, an orthographic projection of at least a partial region of one of the openings on the light-emitting layer coincides with the light-emitting units, and the second member is filled in the openings;
at least a partial edge of one of the openings comprises a first inclined surface, a second inclined surface positioned on the first inclined surface, and a first connecting portion connecting the first inclined surface and the second inclined surface, wherein an orthographic projection of at least part of the second inclined surface on a plane of a position of the light-emitting layer coincides with an orthographic projection of at least part of the first inclined surface on the plane of the position of the light-emitting layer; and
wherein an optical refractive index of the second member is greater than an optical refractive index of the first member, wherein the opening further comprises a third inclined surface positioned on the second inclined surface and a second connecting portion connecting the second inclined surface and the third inclined surface.

14. The display panel according to claim 13, wherein an orthographic projection of at least part of the third inclined surface on the plane of the position of the light-emitting layer coincides with the orthographic projection of at least part of the second inclined surface on the plane of the position of the light-emitting layer.

15. A display device, comprising a display panel, wherein the display panel comprises:
a light-emitting layer comprising a plurality of light-emitting units; and
a light-concentrating layer positioned on the light-emitting layer and comprising a first member and a second member, wherein the first member comprises a plurality of openings, an orthographic projection of at least a partial region of one of the openings on the light-emitting layer coincides with the light-emitting units, and the second member is filled in the openings;
at least a partial edge of one of the openings comprises a first inclined surface, a second inclined surface positioned on the first inclined surface, and a first connecting portion connecting the first inclined surface and the second inclined surface, wherein an orthographic projection of at least part of the second inclined surface on a plane of a position of the light-emitting layer coincides with an orthographic projection of at least part of the first inclined surface on the plane of the position of the light-emitting layer; and
wherein an optical refractive index of the second member is greater than an optical refractive index of the first member; both the first inclined surface and the second inclined surface are annular inclined surfaces surrounding the edge of the opening, in a reference plane parallel to the plane of the position of the light-emitting layer, a first included angle is between the first inclined surface and the reference plane, and a second included angle is between the second inclined surface and the reference plane, and wherein the first included angle and the second included angle are both acute angles.

16. The display device according to claim 15, further comprising a touch layer and a polarizer, wherein
the touch layer is positioned on the light-emitting layer;
the light-concentrating layer is positioned on the touch layer; and
the polarizer is positioned on the light-concentrating layer.

17. The display device according to claim 15, wherein the opening further comprises a third inclined surface positioned on the second inclined surface, and a second connecting portion connecting the second inclined surface and the third inclined surface, and wherein an orthographic projection of at least part of the third inclined surface on the plane of the position of the light-emitting layer coincides with the orthographic projection of at least part of the second inclined surface on the plane of the position of the light-emitting layer.

18. The display device according to claim 17, wherein the first inclined surface, the second inclined surface, and the third inclined surface all comprise an arc-shaped surface.

19. The display device according to claim 15, wherein the first included angle is equal to the second included angle.

20. The display device according to claim 15, wherein a height of the first inclined surface in a direction perpendicular to the plane of the position of the light-emitting layer is equal to a height of the second inclined surface in the direction perpendicular to the plane of the position of the light-emitting layer.

* * * * *